United States Patent [19]
Ando

[11] Patent Number: 6,115,296
[45] Date of Patent: Sep. 5, 2000

[54] SEMICONDUCTOR MEMORY DEVICE CAPABLE OF REDUCING A LEAK CURRENT FLOWING THROUGH A SUBSTRATE

[75] Inventor: Yasuhiro Ando, Tokyo, Japan

[73] Assignee: NEC Corporation, Tokyo, Japan

[21] Appl. No.: 09/228,275

[22] Filed: Jan. 11, 1999

[30] Foreign Application Priority Data

Jan. 9, 1998 [JP] Japan .................................. 10-002733

[51] Int. Cl.[7] .................................................. G11C 16/04
[52] U.S. Cl. ............................ 365/189.09; 365/185.18; 365/185.27
[58] Field of Search ........................ 365/189.09, 185.27, 365/185.18; 327/534, 537

[56] References Cited

U.S. PATENT DOCUMENTS 5,815,032  9/1998  Ariki et al. .............................. 327/534
5,966,043  10/1999  Jinbo ....................................... 327/530
5,986,924  11/1999  Yamada .................................. 365/156

*Primary Examiner*—Richard Elms
*Assistant Examiner*—Tuan T. Nguyen
*Attorney, Agent, or Firm*—Sughrue, Mion, Zinn, Macpeak & Seas, PLLC

[57] ABSTRACT

In a semiconductor memory device composed of a set of SRAM cells connected in common to one another through a word line and a common connection line, a substrate potential generation circuit is connected to the word line to supply the SRAM cells through the common connection line with a substrate potential determined by a selected or a non-selected state of the word line. The substrate potential is equal to a ground potential in the selected state or is put into a negative potential in the non-selected state. The substrate potential is given to each of drive transistors included in each SRAM to reduce a leak current.

16 Claims, 3 Drawing Sheets

SEMICONDUCTOR MEMORY DEVICE CAPABLE OF REDUCING A LEAK CURRENT FLOWING THROUGH A SUBSTRATE

BACKGROUND OF THE INVENTION

This invention relates to a semiconductor memory device which has a plurality of memory cells formed in a substrate.

Heretofore, a wide variety of semiconductor memory devices have been used in a lot of engineering fields with different purposes. As well known in the art, the semiconductor memory devices are generally classified into a read-only-memory (ROM) device and a random access memory (RAM) device which is readable and writable. It is also well known in the art that the latter RAM device is subdivided into a dynamic RAM (DRAM) device and a static RAM (SRAM) device. The DRAM needs to be refreshed to keep information while the SRAM can keep information as long as an electric voltage is impressed to the SRAM from a power source.

Among the above-enumerated semiconductor memory devices, the static RAM (SRAM) device is formed on a semiconductor substrate and has an array of memory cells arranged in rows and columns, a plurality of digit lines along the columns, and a plurality of word lines along the rows.

In this event, each of the memory cells is implemented by a flip-flop circuit and has generally a pair of drive transistors and a pair of information storage transistors, connected to the drive transistors to form the flip flop circuit, and a pair of selection transistors connected to the digit and the word lines.

Furthermore, the SRAM device further has a common line laid along each row and a substrate line for giving a substrate voltage to the substrate. A substrate voltage control circuit is connected to the common line and the substrate line to control a leak current which flows through the drive transistors of each memory cell towards the substrate. The substrate voltage control circuit is turned on or off in response to a chip enable signal common to all of the memory cells on the substrate.

With this structure, it is possible to reduce the leak current in the absence of the chip enable signal because the substrate voltage control circuit is kept in the off-state.

However, such a leak current can not be reduced when the substrate voltage generation circuit is turned on in response to the chip enable signal.

A wide variety of substrate voltage control circuits have been proposed, for example, in Japanese Unexamined Patent Publication Nos. Hei 4-281299 (281299/1992), and Hei 7-142688 (142688/1995). It is to be noted that such substrate voltage control circuits are never directed to an SRAM but to an EEPROM or a non-volatile memory device.

Alternatively, a substrate voltage control circuit disclosed in Hei 2-96998 (96998/1990) serves to prevent an inner logic circuit from being destroyed on occurrence of an excessive voltage in an RAM. Consideration is in this reference made at all neither about an SRAM or about a reduction of a leak current which flows through each drive transistor.

SUMMARY OF THE INVENTION

It is an object of this invention to provide a semiconductor memory device which is capable of reducing a leak current which flows towards a substrate.

It is another object of this invention to provide a semiconductor memory device of the type described, which is capable of controlling the leak current without depending upon a chip enable signal.

It is still another object of this invention to provide a semiconductor memory device of the type described, which is operable as a static RAM (SRM).

It is yet another object of this invention to provide a semiconductor memory device of the type described, which has a voltage generation circuit suitable for the SRAM.

A substrate potential generation circuit to which this invention is applicable is for use in a semiconductor memory device which is formed in a substrate and which has a plurality of memory cells coupled to a word line selectively supplied with different voltages. According to an aspect of this invention, the substrate potential generation circuit comprises an electronic circuit connected to the word line for producing a substrate potential in response to the different voltages given through the word line and a connection circuit for supplying the substrate potential to each of the memory cells to control each substrate potential of each memory cell.

In this event, each of the memory cells has a drive circuit which is controlled by the substrate potential voltage. The connection circuit is connected in common to each of the drive circuits of the memory cells and may be a common connection line.

According to another aspect of this invention, a semiconductor memory device is formed in a substrate and has a plurality of word lines and comprises a plurality of memory cells coupled to each of the word lines and to a common connection line. Further substrate potential generation circuit is connected to each of the word lines and the common connection line, for supplying the common connection line with a substrate potential determined in response to voltages given through the word line, to deliver the substrate potential to the plurality of the memory cells.

According to still another object of this invention, a semiconductor memory device comprises a plurality of memory cells connected to the plurality of the word lines and to a plurality of common connection lines, respectively. A logic element is connected in common to the plurality of the word lines for selectively producing a selected signal and a non-selected signal. And a substrate potential generation circuit, supplied with the selected signal is the non-selected signal and connected to the plurality of the common connection lines, for supplying each of the common connection lines with a substrate potential determined in response to the selected and the non-selected signals, to deliver the substrate potential to the plurality of the memory cells for the plurality of the word lines.

DESCRIPTION OF THE PREFERRED

Figure 1:
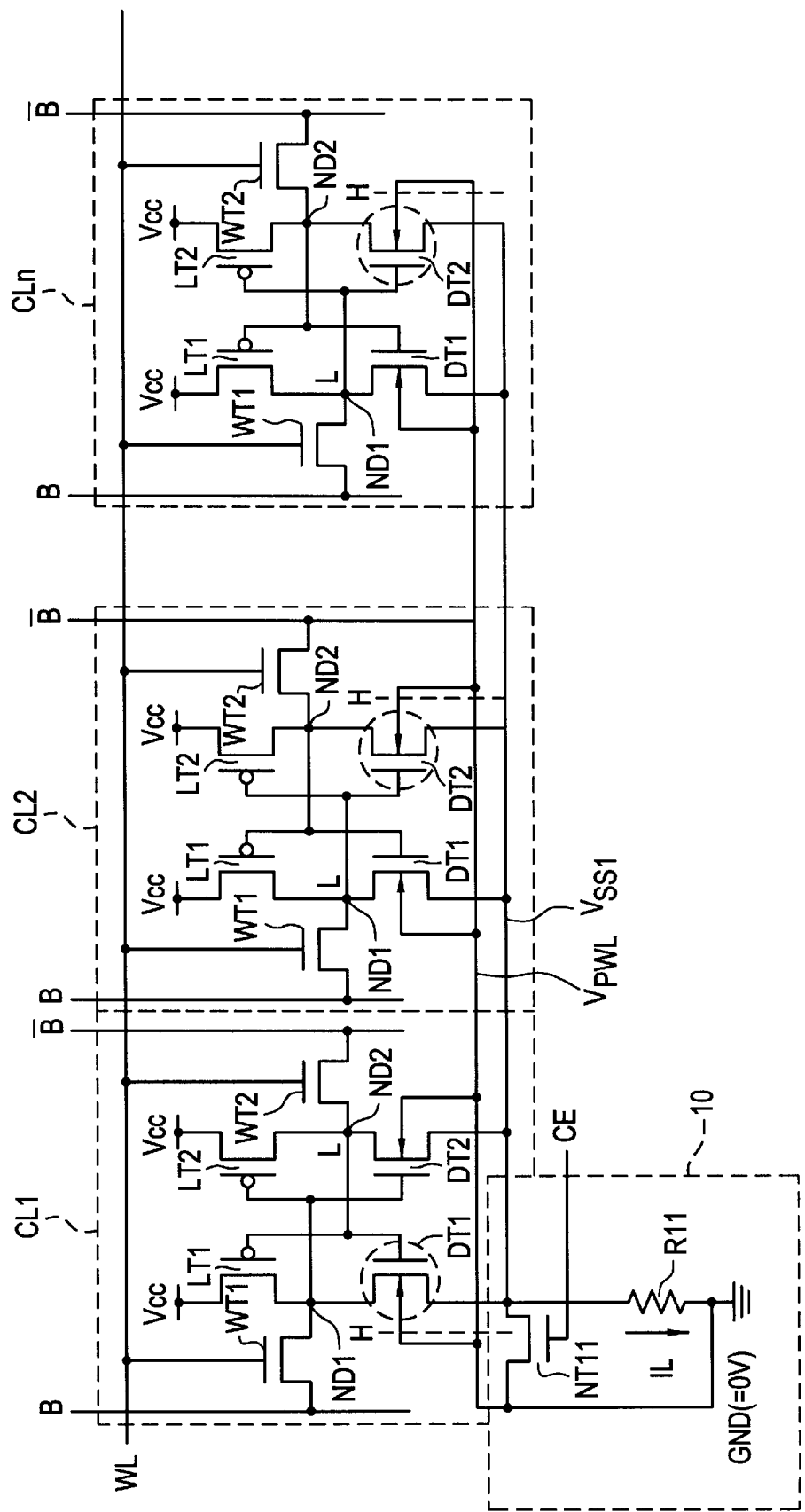
FIG. 1 is a circuit diagram for use in describing a conventional semiconductor memory device.

Referring to FIG. 1, description will be made about a conventional semiconductor memory device for a better understanding of the invention. The illustrated semiconductor memory device forms an SRAM and will be mentioned as the SRAM hereinafter. As shown in FIG. 1, the illustrated SRAM has an array of memory cells arranged in rows and columns, although a single row of the memory cells CL1 to CLn alone is illustrated in FIG. 1.

In the illustrated example, a word line WL is arranged along a row direction and is common to the memory cells CL1 to CLn while a pair of digit lines (or bit lines) B and B bar runs along a column direction at every memory cell CL1 to CLn. This shows that the digit lines B are common to the memory cells arranged along the column direction.

As shown in FIG. 1, each of the memory cells is similar in structure and operation to the other memory cells and therefore, only one of the memory cells CL1 will be mainly described hereinafter. Each of the memory cells CL1 to CLn is structured by the use of MOS transistors and has a pair of information storage transistors LT1 and LT2, a pair of drive transistors DT1 and DT2, and a pair of selection transistors WT1 and WT2. In the illustrated example, each of the information storage transistors LT1 and LT2 is implemented by a p-channel MOS transistor while each of the remaining transistors, namely, each of the drive transistors DT1 and DT2 and the selection transistors WT1 and WT2 is implemented by an n-channel MOS transistor.

More specifically, the information storage transistors LT1 and LT2 are connected to the drive transistors DT1 and DT2 to form a flip-flop circuit. To this end, the information storage transistors LT1 and LT2 have source electrodes supplied with a source voltage Vcc from a power source and drain electrodes connected to drain electrodes of the drive transistors DT1 and DT2 at first and second points ND1 and ND2 of connections, respectively. Furthermore, the information storage transistors LT1 and LT2 have gate electrodes connected to gate electrodes of the drive transistors DT1 and DT2 through first and second common connection points, respectively. The first common connection point is connected to the second point ND2 of connection while the second common connection point is connected to the first point of connection ND1. Thus, the first and the second common connection points of the gate electrodes are connected to the second and the first points ND2 and ND1 of connections diagonally or crosswise, as illustrated in FIG. 1.

Moreover, it is to be noted that each of the drive transistors DT1 and DT2 has a substrate gate kept at a substrate potential $V_{PWL}$ or connected to a substrate potential line ($V_{PWL}$) and a source electrode connected to a source common connection line (Vss1), as shown in FIG. 1.

The substrate potential line ($V_{PWL}$) and the source common connection line (Vss1) are connected to a substrate potential control circuit 10. The illustrated potential control circuit 10 has an n-channel MOS transistor NT11 and a resistor element R11. The n-channel MOS transistor NT11 has a drain electrode and a source electrode grounded (GND). The drain electrode of the n-channel MOS transistor NT11 is connected to the source common connection line (Vss1) on one hand and is grounded through the resistor element R11 on the other hand. In addition, a gate electrode of the n-channel MOS transistor NT11 is supplied with a chip enable signal CE when a chip is selected.

With this structure, the n-channel MOS transistor NT11 is kept in an off-state or in a non-conductive state when the chip enable signal CE is not given to the gate electrode of the n-channel MOS transistor NT11. In this event, the n-channel MOS transistor NT11 is kept in a standby state. In the standby state, a leak current IL is inevitably caused to flow from each of the drive transistors DT1 and DT2 and through the resistor element R11 towards the substrate. As a result, the leak current IL brings about occurrence of an electric potential which causes a potential difference to occur between the source common connection line (Vss1) and the substrate kept at the ground potential. Such an electric potential serves to bias the substrate and consequently to increase a threshold voltage Vth of each drive transistors DT1 and DT2. An increase of the threshold voltage Vth results in a reduction of the leak current IL.

On the other hand, the source common connection line (Vss1) is grounded when the chip is selected by the chip enable signal CE. This means that all the source electrodes of the drive transistors DT1 and DT2 included in the chip are grounded and take the same electric potential as the ground. Thus, the leak current IL can not be reduced during selection of the chip.

An increase of the source common connection line (Vss1) leads to a reduction of an electric potential between the source electrode and the drain electrode of each drive transistor DT1 and DT2. This deteriorates a memory characteristic of each memory cell CL1 to CLn.

Figure 2:
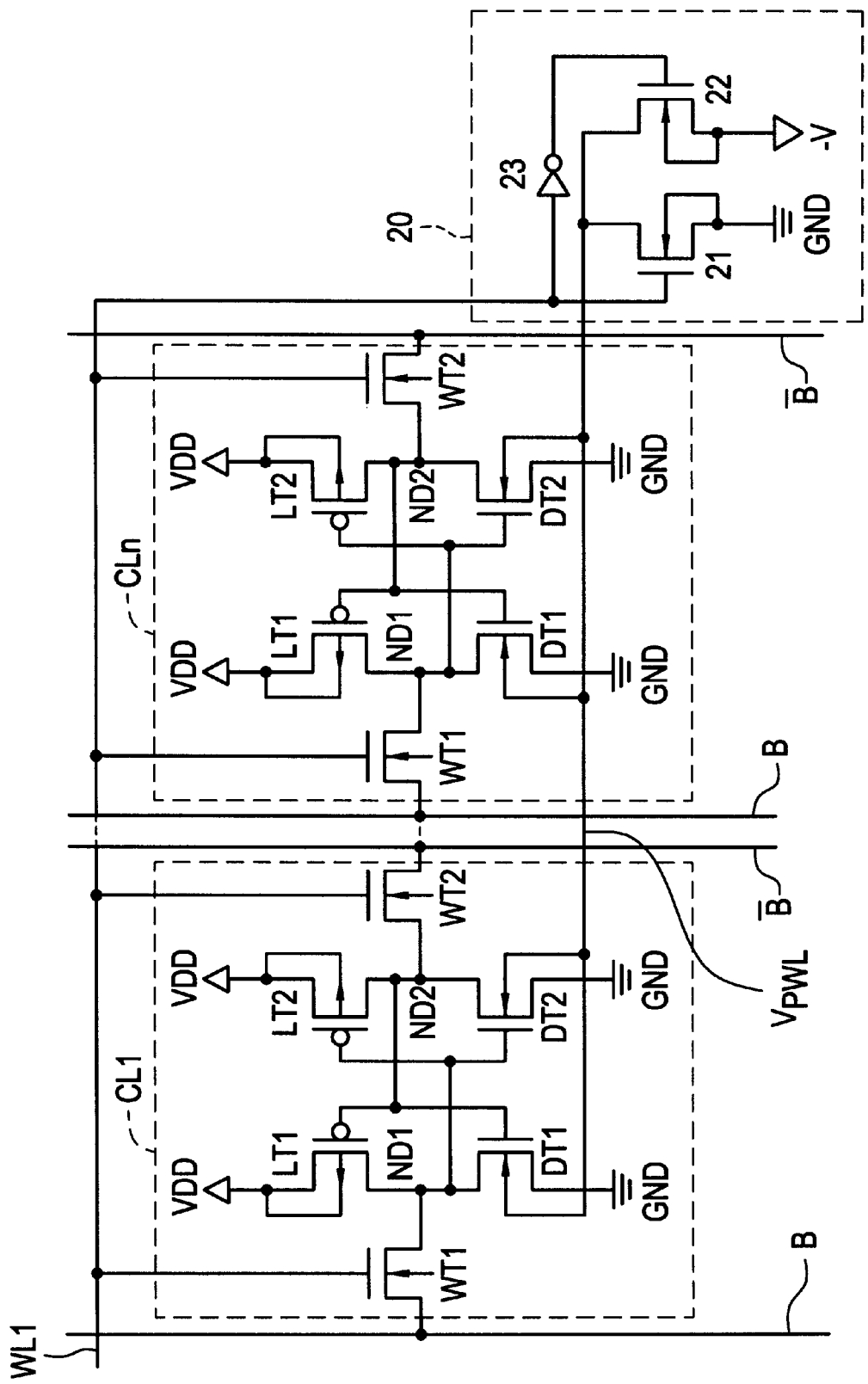
FIG. 2 is a circuit diagram of a semiconductor memory device according to a first embodiment of this invention.

Referring to FIG. 2, a semiconductor memory device according to a first embodiment of this invention comprises similar parts designated by like reference numerals and symbols in FIG. 1. Like in FIG. 1, each of the memory cells CL1 and CL2 has the drive transistor pair DT1 and DT2, the information storage transistor pair LT1 and LT2, and the selection transistor pair WT1 and WT2. In the illustrated example, each of the information storage transistors LT1 and LT2 is implemented by a p-channel MOS transistor and has a substrate gate connected in common to a source electrode and supplied with a source voltage VDD from a power source (VDD).

Each of the drive transistors DT1 and DT2 is implemented by an n-channel MOS transistor and is connected to each of the information storage transistors LT1 and LT2 in a manner similar to that shown in FIG. 1. It is to be noted that each of the drive transistors DT1 and DT2 has a source electrode grounded and a substrate gate which is connected in common to a substrate potential line ($V_{PWL}$) This structure is different from FIG. 1.

In addition, each of the selection transistors WT1 and WT2 has the gate electrode connected to the word line WL and the drain electrode connected to the digit line B or B bar.

In the illustrated example, both the word line WL and the substrate potential line ($V_{PWL}$) are connected to a substrate potential generation circuit 20. It is assumed that the substrate potential generation circuit 20 is provided at every word and that a single word arranged along each row alone is selected one at a time. In other words, only one of the word lines is put into a selected state of a high level while the remaining word lines are kept into a nonselected state of a low level.

Now, the illustrated substrate potential generation circuit 20 has first and second n-channel MOS transistors 21 and 22 each of which has a drain electrode connected in common to the substrate potential line ($V_{PWL}$). Herein, it is to be noted that the word line WL is connected direct to a gate electrode of the first n-channel MOS transistor 21 and is connected to a gate electrode of the second n-channel MOS transistor 22 through an inverter 23. Furthermore, the first n-channel MOS transistor 21 has a substrate gate which is common to the source electrode and which is grounded while the second n-channel MOS transistor 22 has a substrate gate which is connected in common to the source electrode thereof and which is supplied with a negative voltage (−V). Such a negative voltage may be, for example, 2.5 Volts or so.

With this structure, the substrate potential line ($V_{PWL}$) is given a ground potential (GND) from the substrate potential generation circuit 20 when the word line WL is put into a selected state of the high level. On the other hand, the substrate potential line ($V_{PWL}$) is given the negative voltage (−V) from the substrate potential generation circuit 20 when the word line WL is put into a non-selected state of the low level.

Specifically, let the high level be given to the illustrated word line WL as a result of selecting the word line WL. Consequently, the memory cells, such as CL1 and CL2, which are connected to the selected word line WL are put into the selected state with the remaining memory cells kept in the non-selected state. In this event, the first n-channel MOS transistor 21 is turned on while the second n-channel MOS transistor 22 is turned off. Therefore, the substrate potential line ($V_{PWL}$) is kept at the ground potential (GND). On the other hand, let the low level be given to the illustrated word line WL which is put into the non-selected state. In this case, the first n-channel MOS transistor 21 is kept in an offstate while the second n-channel MOS transistor 22 is turned on through the inverter 23. Accordingly, the substrate potential line ($V_{PWL}$) is supplied with the negative voltage (−V) from an external power source (not shown).

As readily understood from FIG. 2, the drive transistors DT1 and DT2 of each memory cell CL1 and CL2 is supplied with a substrate potential from the substrate potential generation circuit 20 through the substrate potential line ($V_{PWL}$). Therefore, the substrate potential of each drive transistor DT1 and DT2 is put into the ground potential when the word is selected and, otherwise, the substrate potential of each drive transistor DT1 and DT2 is put into the negative voltage (−V). At any rate, each drive transistor DT1 and DT2 of the respective memory cells, namely, the substrate potential is always kept at a potential not greater than the ground potential.

Under the circumstances, a combination of the first and the second n-channel MOS transistors 21 and 22 and the inverter 23 may be collectively called an electronic circuit for producing the substrate potential voltage in response to the different voltages given through the word line WL. In addition, the substrate potential may be referred to as a connection circuit for supplying the substrate potential voltage to each of the memory cells to control each substrate potential of each memory cell.

Herein, it is noted that a leak current is mainly caused to occur in the drive transistors DT1 and DT2, namely, the n-channel MOS transistors and especially might become large depending upon a higher one of source voltages given to the source electrodes of the drive transistors DT1 and DT2. However, both the source electrodes of the drive transistors DT1 and DT2 are always grounded in the illustrated structure without depending upon the selected or the non-selected states. Accordingly, the illustrated structure can reduce the leak current which is caused to flow due to imbalance of the source voltages given to the source electrodes of the drive transistors DT1 and DT2.

Moreover, the substrate potential is kept at the negative potential during the non-selected state that lasts for a very long time in comparison with the selected state. Such a negative substrate potential brings about a back-bias effect during the nonselected state and is very effective to reduce the leak current which is caused to flow through the drive transistors DT1 and DT2.

In addition, the substrate potential is kept at the ground potential even during the selected state. This makes it possible to drive each memory cell without a reduction of a drive amplitude of a drive signal given to the digit lines B and B bar.

Figure 3:
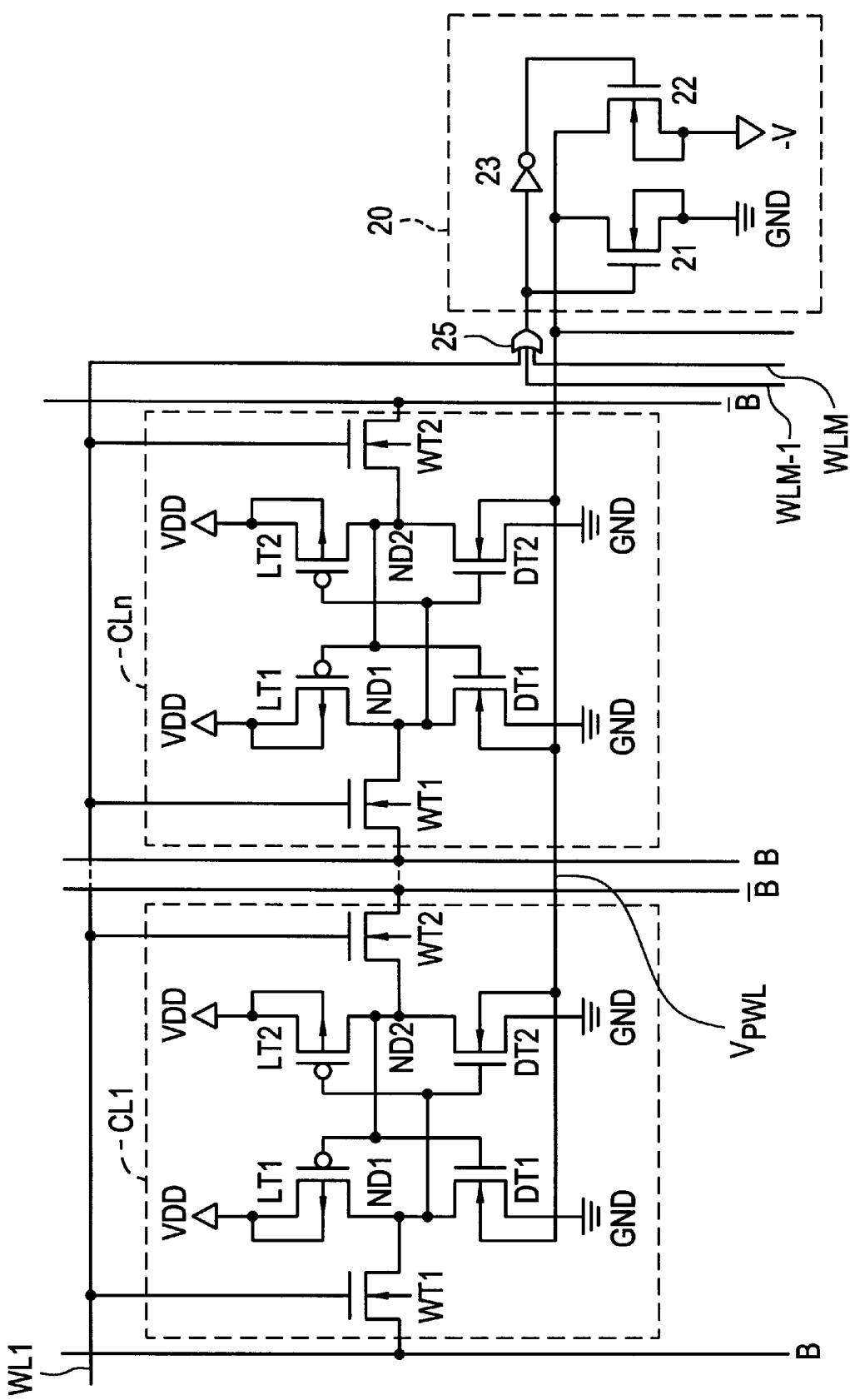
FIG. 3 is a circuit diagram of a semiconductor memory device according to a second embodiment of this invention.

Referring to FIG. 3, a semiconductor memory device according to a second embodiment of this invention is similar in structure and operation to that illustrated in FIG. 2. However, the illustrated semiconductor memory device is different from that illustrated in FIG. 1 in that an OR gate 25 is connected between the single substrate potential generation circuit 20 and a plurality of words each of which is composed of a plurality of memory cells, such as the memory cells CL1 and CL2. In other words, the substrate potential generation circuit 20 is common to the plurality of the words. In the example illustrated, the number of the words is assumed to be equal to m.

Specifically, the OR gate 25 is connected to first through math ones of the word lines depicted by WL1 to WLm, as illustrated in FIG. 3. This structure is very effective when each word can not be individually isolated from one another by a well formed in the substrate. In other words, the OR gate 25 may be called a logic element which is connected in common to the plurality of the word lines and which serves to selectively produce a selected signal and a non-selected signal.

The illustrated substrate potential generation circuit 20 is supplied with the selected signal and the non-selected signal from the OR gate 25 and is connected to the plurality of the source common connection lines for the other memory cells. As a result, the substrate potential generation circuit 20 is operable in response to the selected and the non-selected signals to deliver the substrate potential to the plurality of the words each of which is composed of the plurality of the memory cells.

At any rate, the illustrated substrate potential generation circuit 20 is connected between each word line WL1 to WLm and the source common connection line (Vss1). The substrate potential generation circuit 20 serves to put each memory cell of the words into the negative potential during the non-selected state and to ground each memory cell in the selected state. Therefore, the leak current of each memory cell can be reduced in every one of the words.

While this invention has thus fir been described in conjunction with a few embodiments thereof, it will readily be possible for those skilled in the art to put this invention into practice in various other manners. For example, this invention is also applicable to an SRAM of a multiple port type, such as a dual port type, or the like.

What is claimed is:

1. A substrate potential generation circuit for use in a semiconductor memory device which is formed in a substrate and which has a plurality of memory cells coupled to a word line selectively supplied with different voltages, comprising:

an electronic circuit connected to the word line for producing a substrate potential in response to the different voltages given through the word line; and a connection circuit for supplying the substrate potential to each of the memory cells to control each substrate potential of each memory cell.

2. A substrate potential generation circuit as claimed in claim 1, wherein each of the memory cells includes a drive circuit which is controlled by the substrate potential voltage, and wherein the connection circuit is connected in common to each of the drive circuits of the memory cells.

3. A substrate potential generation circuit as claimed in claim 2, wherein the electronic circuit comprises:

an inverter connected to the word line; and a transistor circuit connected to the word line, the inverter, and the connection circuit for selectively supplying a ground potential and a negative potential as the substrate potential to the connection circuit in response to the different voltages sent through the word line.

4. A substrate potential generation circuit as claimed in claim 3, wherein the transistor circuit comprises:
   a first transistor, connected to a ground, the connection circuit, and the word line, to selectively produce the ground potential as the substrate potential through the connection circuit when the first transistor is turned on in response to a selected one of the different voltages sent through the word line; and
   a second transistor, connected to the inverter and the connection circuit and supplied with the negative potential, to selectively produce the negative potential as the substrate potential through the connection circuit when the second transistor is turned on in response to another one of the different voltages.

5. A substrate potential generation circuit as claimed in claim 4, wherein each of the first and the second transistors is implemented by an n-channel MOS transistor.

6. A semiconductor memory device which is formed in a substrate and which has a plurality of word lines, said semiconductor memory device comprising:
   a plurality of memory cells coupled to each of the word lines and to a common connection line; and
   a substrate potential generation circuit, connected to each of the word lines and the common connection line, for supplying the common connection line with a substrate potential determined in response to voltages given through the word line, to deliver the substrate potential to the plurality of the memory cells.

7. A semiconductor memory device as claimed in claim 6, wherein each of the memory cells is implemented by a static RAM (SRAM).

8. A semiconductor memory device as claimed in claim 7, wherein each of the word lines is selectively put into a selected state and a non-selected state, and wherein the substrate potential generation circuit produces, as the substrate potential, a ground potential and a negative potential in the selected state and the non-selected state, respectively.

9. A semiconductor memory device as claimed in claim 8, wherein each of the memory cells comprises:
   a pair of drive transistors connected to the common connection line and also connected to a ground;
   a pair of information storage transistors connected to the drive transistors to form each of the memory cells in the SRAM; and
   a pair of selection transistors connected to each of the memory cells and each of the word lines.

10. A semiconductor memory device as claimed in claim 9, wherein each of the drive transistors and the selection transistors is implemented by an n-channel MOS transistor while each of the information storage transistors is implemented by a p-channel MOS transistor.

11. A semiconductor memory device as claimed in claim 10, wherein the substrate potential generation circuit comprises:
   an inverter connected to the word line; and
   a transistor circuit connected to the word line, the inverter, and the common connection line for selectively producing the ground potential and the negative potential as the substrate potential in the selected and the non-selected states, respectively.

12. A semiconductor memory device as claimed in claim 11, wherein the transistor circuit comprises:
   a first transistor, connected to a ground, the common connection circuit, and the word line, to selectively produce the ground potential as the substrate potential through the common connection line when the first transistor is turned on in the selected state; and
   a second transistor, connected to the inverter and the common connection line and supplied with the negative potential, to selectively produce the negative potential as the substrate potential through the common connection line when the second transistor is turned on in the non-selected state.

13. A semiconductor memory device as claimed in claim 12, wherein each of the first and the second transistors is implemented by an n-channel MOS transistor.

14. A semiconductor memory device which is formed in a substrate and which has a plurality of word lines, comprising:
   a plurality of memory cells connected to the plurality of the word lines and to a plurality of common connection lines, respectively;
   a logic element connected in common to the plurality of the word lines for selectively producing a selected signal and a non-selected signal; and
   a substrate potential generation circuit, supplied with the selected signal and the non-selected signal and connected to the plurality of the common connection lines, for supplying each of the common connection lines with a substrate potential determined in response to the selected and the non-selected signals, to deliver the substrate potential to the plurality of the memory cells for the plurality of the word lines.

15. A method of providing substrate potential for reducing leak current in a semiconductor memory formed in a substrate, said semiconductor memory having a word line and a substrate gate potential line, wherein a voltage is provided on said word line corresponding to a selected state and non-selected state, said method comprising:
   grounding said substrate gate potential line when said voltage indicates a selected state; and
   biasing said substrate potential line with a negative potential when said voltage indicates a non-selected state.

16. The method according to claim 15, wherein said grounding and said biasing of said substrate line comprises:
   detecting the voltage provided on said word line in a substrate potential generation circuit;
   if said voltage detected by said substrate potential generating circuit indicates a selected state, then
      a.) switching the substrate potential generation circuit to a ground; and
      b.) outputting the ground from said substrate potential generation circuit to said substrate gate potential line; and
   if said voltage detected by said substrate potential generating circuit indicates a non-selected state, then
      c.) switching the substrate potential generation circuit to a negative bias; and
      d.) outputting the negative bias to said substrate gate potential line.

* * * * *